(12) United States Patent
Newman

(10) Patent No.: US 6,301,284 B1
(45) Date of Patent: Oct. 9, 2001

(54) NARROW BAND UV LASER WITH VISIBLE LIGHT GUIDE LASER

(75) Inventor: Peter C. Newman, Encinitas, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 09/241,240

(22) Filed: Feb. 1, 1999

(51) Int. Cl.⁷ ........................................................ H01S 3/00
(52) U.S. Cl. ............................................. 372/109; 372/57
(58) Field of Search ........................................ 372/55, 57

(56) References Cited

U.S. PATENT DOCUMENTS 5,164,565 * 11/1992 Addiego ........................... 219/121.68

* cited by examiner

Primary Examiner—Teresa M. Arroyo
Assistant Examiner—Gioacchino Inzirillo
(74) Attorney, Agent, or Firm—John R. Ross, Esq.

(57) ABSTRACT

A visible light alignment system mounted on a line narrowing module of a UV laser. The system includes an alignment platform on which a small visible light laser is mounted and beam directing optics to direct the visible light beam to reflect off an illumination surface of a first prism in a prism beam expander at an angle such that the visible light beam proceeds collinearly with the UV laser output beam.

5 Claims, 2 Drawing Sheets

NARROW BAND UV LASER WITH VISIBLE LIGHT GUIDE LASER

BACKGROUND OF THE INVENTION

The state of the art light source for integrated circuit lithography is the excimer laser, primarily the KrF 248 nm excimer laser. The laser provides illumination for a stepper or scanner machine which is used to produce the integrated circuits on silicon wafers. The stepper and scanner machines are very expensive costing several million dollars and they are typically operated virtually 24 hours per day seven days per week. Alignment of the beam delivery system from the laser to the stepper or scanner can be a complicated job. The alignment can be done with the laser operating using the UV beam for alignment. Such techniques are complicated by the fact that the UV beam is invisible and also presents a serious eye hazard. Also, sometimes alignment checks are needed when the laser is not operating. An alternative technique involves insertion of a small visible light laser somewhere in the optical train and using its beam to simulate the location of the UV laser beam.

FIG. 1 shows the principal features of a prior art 248 nm KrF narrow band excimer used extensively as an illumination source for integrated circuit lithography. The laser system comprises laser chamber 2 which contains a gain medium produced by high voltage pulses applied to two elongated electrodes discharging at rates of about 1,000 Hz through a circulating gas comprised of 0.1% fluorine, 1% krypton and the balance neon at about 3 atmospheres. The resonance chamber is defined by an output coupler 6 comprising a partially reflecting mirror (of about 0.1R) and a line narrowing module 7 comprised of: (1) a prism beam expander package 18 comprised of three prisms 8, 10 and 12, all mounted on a prism alignment plate 22 which can be moved laterally to precisely align the LNM 7 with output coupler 6 and (2) a pivotable tuning mirror 14 and a grating 16 configured in a Littrow configuration to reflect back through the prism beam expander to the gain medium, a selected narrow wavelength band of the spectrum produced in the gain medium. Alignment equipment in a prior art laser system includes a removable mirror and a positionable visible laser diode, mounted to output coupler module 6, on the side facing away from chamber 2. The mirror can be repeatably positioned to block the UV beam and fold the visible beam into the same optical path. The visible laser is provided with angle and position adjustments which allow the visible beam to be made collinear with the UV beam.

What is needed is a better, faster alignment system and technique for aligning narrow band UV lasers and associated stepper and scanner machines.

SUMMARY OF THE INVENTION

The present invention comprises a visible light alignment system mounted on a line narrowing module of a UV laser. The system includes an alignment platform on which a small visible light laser is mounted and beam directing optics to direct the visible light beam to reflect off an illumination surface of a first prism in a prism beam expander at an angle such that the visible light beam proceeds collinearly with the UV laser output beam.

DETAILED DESCRIPTION OF THE PREFERRED EMBODIMENTS

Figure 1:
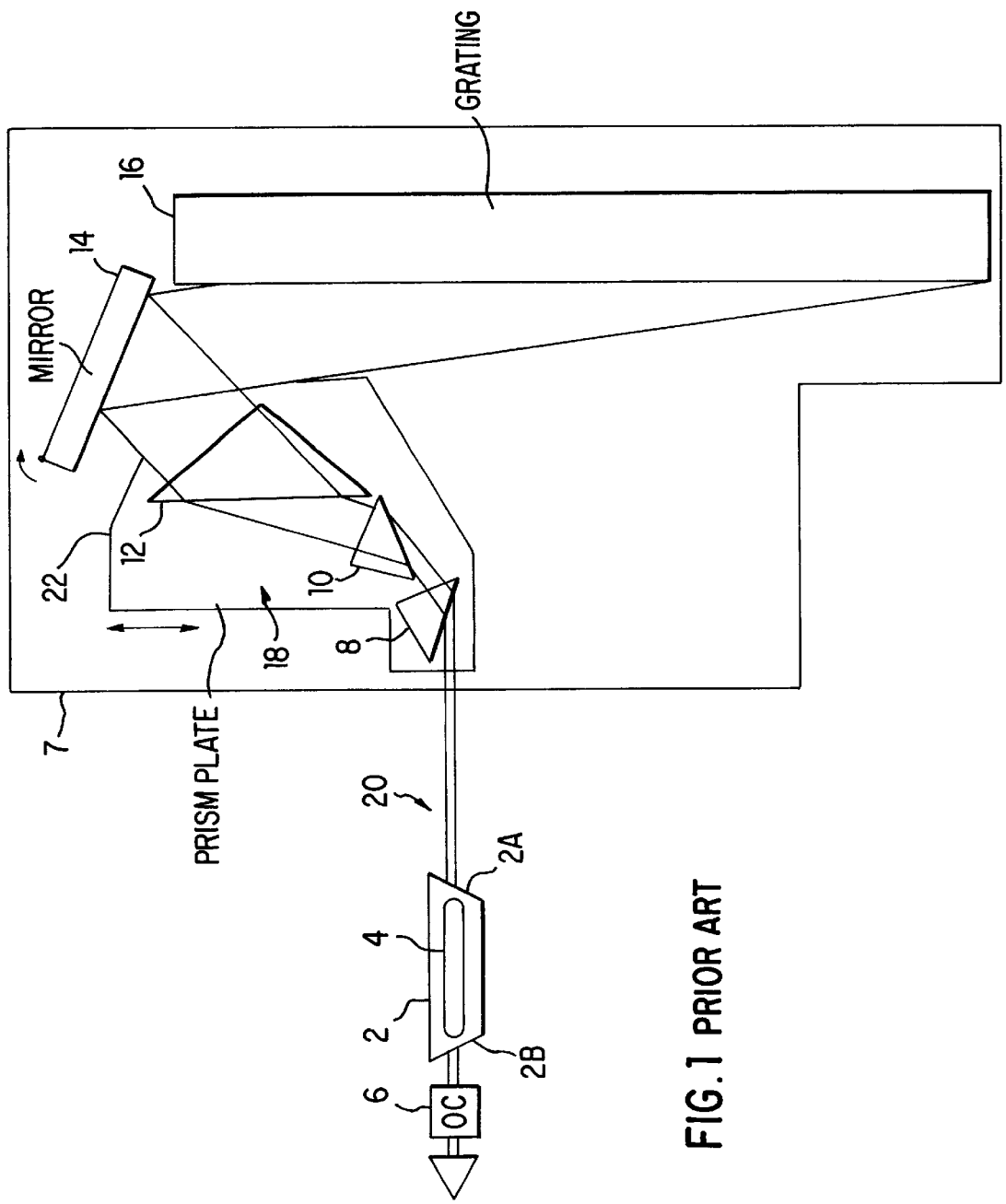
FIG. 1 is a drawing of a prior art narrow band excimer laser system.
Figure 2:
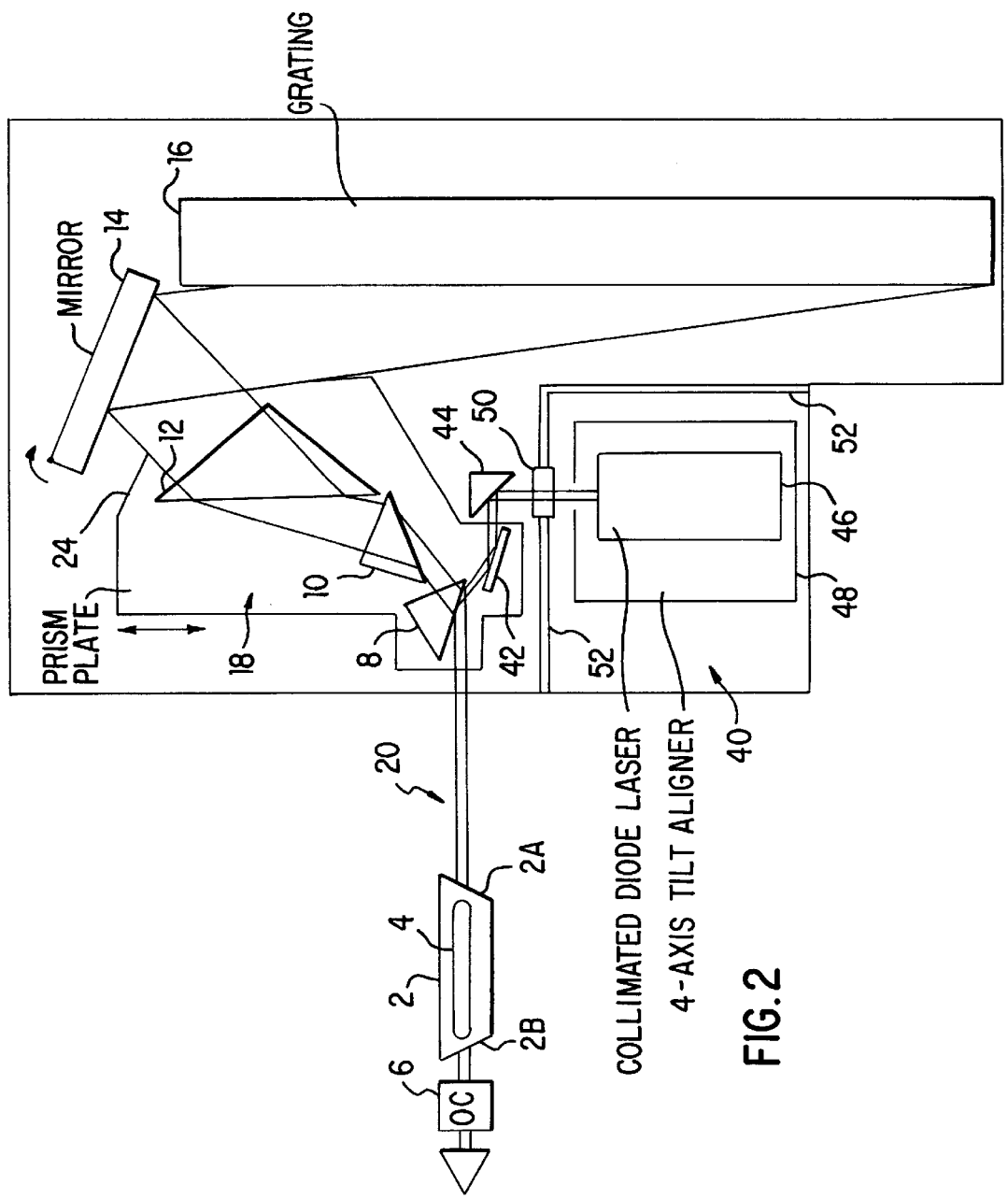
FIG. 2 is a drawing of a narrow band excimer laser system having a guide laser system in accordance with the present invention.

A preferred embodiment of the present invention can be described by reference to FIG. 2. The FIG. 2 system is just like the FIG. 1 prior art laser system with the addition of laser alignment system 40 as shown in FIG. 2. The system is added to the prior art line narrowing module 7. The system includes collimated laser 46 such as a diode laser or a He Ne laser producing visible light. These lasers are available from suppliers such as Power Technology, Inc. (PTI) with offices in Arkansas. A preferred off-the-shelf laser would be PTI Model No. PM03(635-5). This laser diode module includes lenses to collimate the visible beam to a divergence comparable to that of the UV laser beam.

The beam from visible laser 46 passes through window 50 and is directed by mirrors 44 and 42 to the surface of beam expansion prism 8. In this particular embodiment, the incident angle of the UV beam is about 70 degrees, and the incident angle of the visible laser beam is chosen to match the UV incident angle so that the visible laser beam becomes co-linear with the UV beam passing through the laser chamber 3, output coupler 4 and continuing co-linearly downstream of output coupler 4. Diode laser 46 is mounted on four-axis tilt aligner 48. In this preferred embodiment, wall 52 separates the alignment laser from the prior art line narrowing components to protect the alignment laser from extensive UV radiation. Also window 50 is comprised of Pyrex which transmits the visible beam but absorbs the UV radiation off prism 8. (Window 50 could also be coated to reflect the UV and in this case it should also be tilted so that the reflected UV does not re-enter chamber 3.) Preferably turning mirror 44 is fixed to the frame of module 7 but relay mirror 42 is mounted on prism plate 24 with the reflecting surface of relay mirror 42 aligned parallel to the opposite surface of prism 8 so that lateral adjustments of prism plate 22 do not affect alignment of the visible beam. Polarization of the two beams should be considered. A preferred approach is to match the polarization of the visible light beam to that of the laser.

Uses

In a typical application, the visible beam is aligned to the UV beam during initial system qualification. This could be performed using either of the basic alignment techniques, pinholes or imaging. In the first technique, two UV fluorescing cards with pinholes are alternately placed in the UV laser beam path; one near the beam output and one at least 2 m further away. The pinholes are visually located at the measured centers of the UV beam images. The UV beam is turned off, and the visible beam is turned on. Suitable adjustments are made to the angle and position of the visible beam to bring it through the center of the two pinholes.

In the imaging technique, an optical system is constructed such that images of both UV and visible beams can be formed on a detector or detectors. These detectors can be used to determine the horizontal and vertical positions of the centers of the two beams. The system is such that images can be formed in two or more planes; for example, one image plane can be at output coupler 6 and another image plane can be at infinity. The locations of the center of the UV beam in these planes can be determined, and the visible beam adjusted to the same locations.

Although the present invention has been described with reference to specific embodiments, the reader should appreciate that various adaptions and modifications could be made. For example, the visible beam could be reflected off a prism surface other than the one shown in FIG. 2 but in this case the differences in refractive indexes for the different wavelengths would need to be taken into account. Therefore, the invention is to be limited only by the appended claims and their legal equivalents.

What is claimed is:

1. A visible light alignment system for a line narrowed UV laser defining a UV output beam direction and having (i) a laser chamber containing a gain medium and (ii) a line narrowing module located outside said chamber, said module containing a prism beam expander including a first prism defining an illumination surface for receiving UV illumination from said chamber in a direction defining an angle with a normal to said illumination surface said alignment system comprising:

A) a multi-axis alignment platform mounted on said line narrowing module;
   B) a visible light laser mounted on said multi-axis alignment platform;
   C) beam directing optics for directing a visible light laser beam from said visible light laser to reflect off the illuminating surface of said first prism and to pass through said gain medium in a direction collinear with the UV output beam direction.

2. A system as in claim 1 wherein said visible light laser is a collimated diode laser.

3. A system as in claim 1 wherein said alignment platform is a fouraxis tilt aligner.

4. A system as in claim 1 wherein said beam directing optics comprises a first mirror and a second mirror.

5. A system as in claim 4 wherein said first mirror is fixedly mounted to said module frame and said second mirror and said first prism are both fixedly mounted to a prism plate positionally adjustable with respect to said module frame.

* * * * *